US010361696B1

(12) United States Patent
Schleicher et al.

(10) Patent No.: US 10,361,696 B1
(45) Date of Patent: Jul. 23, 2019

(54) RF SENSOR IN STACKED TRANSISTORS

(71) Applicant: Infineon Technologies AG, Neubiberg (DE)

(72) Inventors: Bernd Schleicher, Ebersberg (DE); Winfried Bakalski, Munich (DE); Ruediger Bauder, FeldkirchenWesterham (DE); Valentyn Solomko, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/264,186

(22) Filed: Jan. 31, 2019

Related U.S. Application Data

(62) Division of application No. 15/891,025, filed on Feb. 7, 2018.

(51) Int. Cl.
*H03K 17/16* (2006.01)
*H03K 17/687* (2006.01)

(52) U.S. Cl.
CPC ....... *H03K 17/161* (2013.01); *H03K 17/6871* (2013.01)

(58) Field of Classification Search
CPC .......................... H03K 17/161; H03K 17/6871
USPC ..................................... 327/382; 455/78, 73
See application file for complete search history.

(56) References Cited

U.S. PATENT DOCUMENTS

| 2007/0270105 A1* | 11/2007 | Uejima | H04B 1/0057 455/78 |
| 2011/0201281 A1* | 8/2011 | Bakalski | H04B 1/48 455/73 |
| 2011/0237207 A1* | 9/2011 | Bauder | H01Q 1/521 455/78 |
| 2013/0278317 A1* | 10/2013 | Iversen | H03H 21/0007 327/308 |
| 2014/0113573 A1* | 4/2014 | Khatri | H03F 1/0277 455/78 |
| 2015/0288359 A1* | 10/2015 | Bakalski | H03K 17/693 307/113 |
| 2015/0349770 A1* | 12/2015 | Bakalski | H04B 1/006 455/78 |

OTHER PUBLICATIONS

Joseph, Alvin, et al., "Power Handling Capability of an SOI RF Switch," RTU2D-2, IEEE Radio Frequency Integrated Circuits Symposium, Jan. 2013, pp. 385-388.
Shifrin, Mitchell B., et al., "Monolithic FET Structures for High-Power Control Component Applications," IEEE Transactions on Microwave Theory Techniques, vol. 37, No. 12, pp. 2134-2141, Dec. 1989.

(Continued)

*Primary Examiner* — Tomi Skibinski
(74) *Attorney, Agent, or Firm* — Slater Matsil, LLP

(57) ABSTRACT

An RF switch includes series-coupled RF switch cells coupled between an RF input and ground, a transistor including a first current node coupled to a first load resistor, a second current node coupled to ground, and a control node coupled to an internal switch node, and a filter having an input coupled to the first current node of the first transistor and an output for providing a DC voltage corresponding to the RF power present at the internal switch node.

20 Claims, 7 Drawing Sheets

(56) References Cited

OTHER PUBLICATIONS

Zhu, Yu et al., "Analytical Model of Voltage Division inside Stacked-FET Switch," TH1G-06, IEEE Proceedings of the Asia-Pacific Microwave Conference (APMC), Nov. 4-7, 2017, pp. 750-752.

Zhu, Yu et al., "High Voltage SOI Stacked Switch with Varying Periphery FETs," IEEE 2015 Asia-Pacific Microwave Conference (APMC), Dec. 6-9, 2015, 3 pages.

* cited by examiner

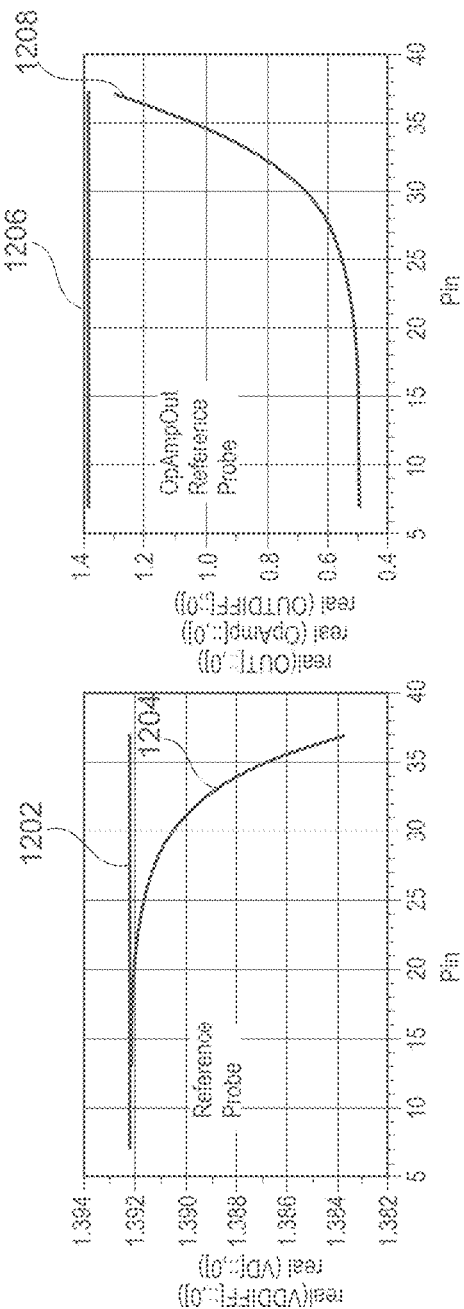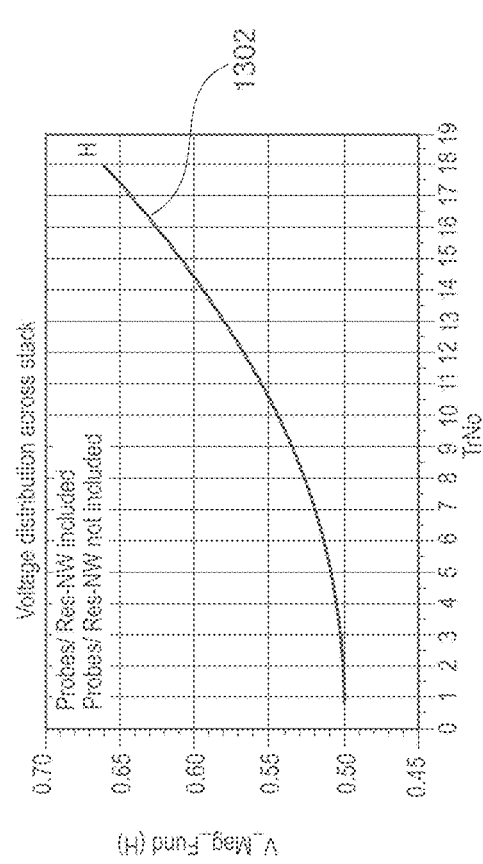
Fig. 12 (a)
Fig. 12 (b)
Fig. 13

RF SENSOR IN STACKED TRANSISTORS

This application is a divisional of U.S. patent application Ser. No. 15/891,025, filed on Feb. 7, 2018, which application is hereby incorporated herein by reference.

TECHNICAL FIELD

The present invention relates generally to an RF sensor for stacked transistors.

BACKGROUND

RF switches having stacked transistors implemented as multiple RF cells are used in a variety of RF circuits to implement various functions in various applications. For instance, one application is a high voltage application such as a connection to an antenna in a cell phone. Multiple RF cells are typically coupled together so that any individual RF cell must only withstand a lower voltage that is a fraction of the high voltage and is thus within the breakdown voltage limits for the transistor manufacturing process used. While the use of multiple RF cells ideally evenly distributes the high voltage equally into low voltage portions across the individual RF cells, in practice the distribution of the high voltage can be unequal due to parasitic elements and effects. Linearity and other performance characteristics of the high voltage RF switch using multiple RF cells can thus be affected.

SUMMARY

An RF switch comprises a plurality of series-coupled RF switch cells coupled between an RF input and ground; a first transistor comprising a first current node coupled to a first load resistor, a second current node coupled to ground, and a control node coupled to a first internal switch node; and a first filter having an input coupled to the first current node of the first transistor and an output configured for providing a DC voltage corresponding to the RF power present at the first internal switch node.

BRIEF DESCRIPTION OF THE DRAWINGS

For a more complete understanding of the present invention, and the advantages thereof, reference is now made to the following descriptions taken in conjunction with the accompanying drawings, in which:

FIG. 12(a) is a plot of the sense and reference voltages of the circuit of FIG. 10 versus stack input power levels;

FIG. 12(b) is a plot of the output voltage of the operational amplifier of the circuit of FIG. 10;

FIG. 13 is a plot of the voltage across the RF switch cells of, for example the circuit of FIG. 8, with and without the voltage sensor circuits being connected showing a negligible difference therebetween;

DETAILED DESCRIPTION OF ILLUSTRATIVE EMBODIMENTS

RF switches having a plurality of coupled RF switch cells are sometimes realized using a bulk CMOS technology, which uses a biased substrate. The transistors used in the RF switch circuit can have a parasitic substrate capacitance and a parasitic resistance coupled between the source of the transistor and ground, and between the drain of the transistor and ground. The voltage at the source and the drain of the transistor thus causes a corresponding parasitic current to flow between the transistor source and drain, and ground. These parasitic elements and effects cause a high voltage impressed across a plurality of coupled RF switch cells to be unequally distributed amongst the individual RF switch cells, with a corresponding degradation of the linearity of the switch as well as a degradation of other performance characteristics. For example, a first RF cell in a plurality of coupled RF cells nearest to the RF source may have a maximum fraction of the high voltage RF input signal; whereas a last RF cell in a plurality of coupled RF cells furthest from the RF source and coupled to ground may have a minimum fraction of the high voltage RF input signal. Ideally, each RF cell in the plurality of coupled RF cells would all have the same fraction of the high voltage RF input voltage for maximum linearity and circuit performance.

Figure 1:
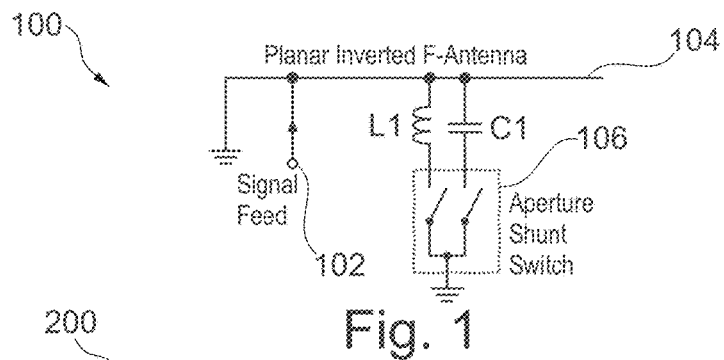
FIG. 1 is a schematic diagram of an antenna switch placed in an example antenna arrangement.

One such area of RF switches is antenna aperture switches, which are used to improve the radiation performance of a mobile phone antenna. Proximate to the switch, external inductances and/or capacitances can be switched-in at positions far from the feed-point of the antenna and tune the antenna to radiate better at selected frequencies. The usage is illustrated in FIG. 1. FIG. 1 shows an antenna switch 106 placed in an example antenna arrangement 100 including an RF signal feed 102, a planar inverted F-antenna, an inductor L1, and a capacitor C1.

Important figures of merit for such switches are its resistance in on-mode (Ron), its capacitance in isolation mode (Coff) and the maximal RF voltage swing it can withstand in isolation mode. The switches are designed in a standard body-biased bulk CMOS or Silicon-On-Insulator (SOI) technology, using single or dual gate-oxide transistors. The nominal voltage withstood by one dual gate-oxide transistor is typically in the range of 1.5 V to 2.5 V, the required RF voltage swing is often much higher, e.g. 45 V, 80 V, or up to 100 V. This requires a stacking of transistors as previously explained to be able to handle the occurring voltage swings. By stacking, the voltage swing should ideally distribute equal between the drain and source node of the transistors, which is supported by the gate-drain and gate-source capacitances. However, due to small parasitic capacitances from drain, gate and source to common ground or to substrate potential, the voltage distribution is unequal. This unequal distribution limits the sustainable overall RF voltage swing and causes an earlier failure of the device, because one transistor experiences a larger voltage swing than the others and therefore has an earlier breakthrough.

Embodiments are made and described below to measure the RF voltage swing present at one or all of the transistors in the RF stack without influencing the wanted behavior of the circuit and report the occurring RF voltage by a DC readout. A first embodiment circuit measures the RF voltage swing across at least one transistor and provides RF swing information regarding internal switch nodes and therefore in the application of the switch, and to provide an output used to initiate measures to reduce the input power if necessary, or to take other measures. A second circuit allows determining the RF voltage across all or a subset of transistors in the stack and by this to report the voltage distribution across each transistor of the stack. This allows visualizing insights of the circuit such as switch linearity and therefore allows comparing semiconductor technologies and circuit design concepts among each other. This information can also be used by a system to change the operating condition of the switch if desired.

The maximal RF voltage swing can also be measured by a destructive measurement, were the RF voltage swing is increased until the device breaks. The breakdown voltage is noted and compared. While this method is effective in determining the voltage limits of the RF switch in a given operating environment, it is of course not effective for use in a system wherein the integrity of the switch is preserved to report out internal switch information so that a system using the switch can take measure to change the operating condition of the switch if desired.

Embodiments therefore allow measuring internal voltages of the circuit, without detuning the general operation of the switch or otherwise affecting the performance of the switch. According to embodiments, only a negligible part of the voltage swing is used to monitor the distribution. The advantage is that voltages of internal nodes are measured and can be read out for to implement further measure.

Figure 2:
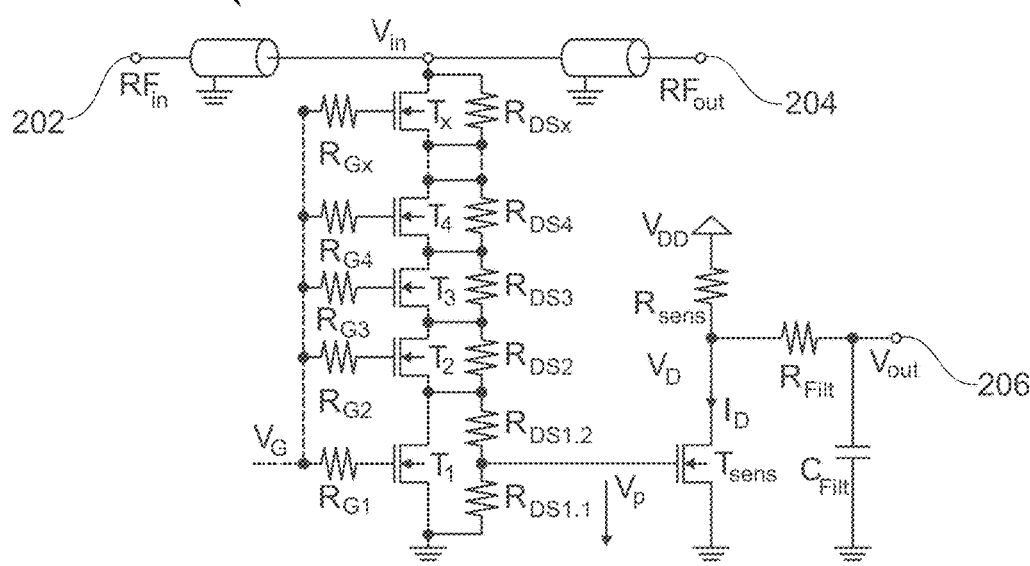
FIG. 2 is an embodiment voltage sensor circuit embedded in the stacked transistors of an RF antenna aperture switch.

FIG. 2 shows a switch arrangement 200 including an RF input $R_{Fin}$ at node 202, a voltage impressed on the RF switch Vin, and an RF output node $R_{Fout}$ at node 204. The RF switch and a sensing circuit are also shown and described in detail below.

A first embodiment voltage sensing circuit is described below with reference to FIG. 2. The sensing circuit senses the RF voltage present in the switch branch in an isolation mode and can be used to report the measured voltage swing to a control unit. In FIG. 2, the stacked transistors $T_1$ to $T_X$ of an RF antenna aperture switch are shown on the left side. The stacked transistors can be switched by a control signal at their gates, shown as $V_G$. The control signal or input signal $V_G$ is used to energize the gates of transistors $T_1$ through $T_X$ through gate resistors $R_{G1}$ through $R_{Gx}$. The resistances parallel to the drain and source of each transistor $R_{DS1}$ to $R_{DSx}$ are used for a good biasing of each transistor and are typically in the range of 3 k to 40 k Ohm. In the off-state, all transistors are pinched off and the series connection of the drain-source resistors is the dominant off-state resistance.

The voltage sensor circuit of FIG. 2 described in further detail below is placed at the lowest drain-source resistor $R_{DS1}$ or a portion of the drain-source resistor $R_{DS1.1}$ to ground node. Resistors $R_{DS1.1}$ and $R_{DS1.2}$ form a voltage divider with a tap providing the $V_P$ (probe) voltage as shown, and a total resistance value of $R_{DS1}$, which is similar in value to the other source to drain resistors shown in FIG. 2.

FIG. 2 shows an embodiment voltage sensor that can be embedded in the stacked transistors of an RF antenna aperture switch. The voltage sensor includes a sense portion and a filter portion. Sense portion includes a sense transistor $T_{sens}$ and a sense load resistor $R_{sens}$. The node coupling the sense transistor and the load resistor has a corresponding node voltage $V_D$. The current flowing into the drain of the sense transistor is labeled $I_D$. The sense portion is coupled between $V_{DD}$ and ground as shown. The filter portion is a low pass filter including a filter resistor $R_{Filt}$ and a filter capacitor $C_{Filt}$. The output of the filter is labeled $V_{out}$ at node 206. The filter portion is coupled between the internal sense circuit node and ground as shown.

Figure 3:
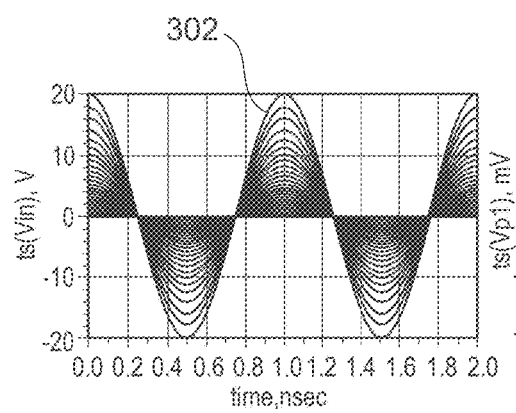
FIG. 3(a) is a plot of a transient voltage input signal to the antenna switch at different power levels.
FIG. 3(b) is a plot of a transient voltage associated with an internal switch node of the RF antenna aperture switch.
Figure 3:
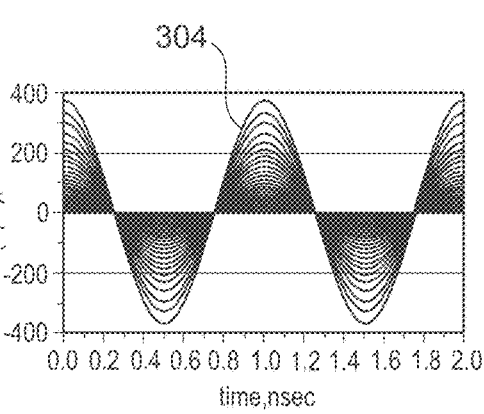

FIG. 3 (a) shows an example input voltage sweep 302 up to a voltage of $V_{in}$=20 V at an example frequency of 1 GHz, which is brought to the input terminal of the RF switch. A proportional fraction of the RF voltage swing is present across the lowest resistor $R_{DS1.1}$, as can be seen in FIG. 3 (b) on an example stack of 18 transistors, drain-source resistors $R_{DS2}$ to $R_{DSx}$ of 3 kOhm and the lowest drain-source resistance $R_{DS1}$ being divided to $R_{DS1.2}$=2 kOhm and $R_{DS1.1}$=1 kOhm. The sensing circuit of FIG. 2 uses this voltage and converts it to a DC readout at node 206 with a sufficient amplitude to be used for further action.

FIG. 3 (a) thus shows a transient voltage of a 1 GHz input signal $V_{in}$ to the antenna switch at different power levels and FIG. 3 (b) shows the corresponding probe voltages $V_P$ at the lowest resistance $R_{DS1.1}$ to ground.

The voltage sensing circuit in FIG. 2 on the right side as previously explained comprises a relatively small NMOS transistor $T_{sens}$, which is DC biased at a gate source voltage of zero volts through the resistor $R_{DS1.1}$ to ground. In this condition biasing condition a small drain current ID flows through transistor $T_{sens}$. When the RF voltage swing is present, the positive voltage swing of $V_P$ activates the sensing transistor and an increased, rectified drain current $I_D$ starts to flow through the transistor. At the resistor $R_{sens}$, connected between the drain and VDD, a voltage drop $V_D$ builds up, which is caused by the rectified current of $I_D$. The half wave rectified current $I_D$ and voltage $V_D$ can be seen in FIGS. 4 (*a*) and 4 (*b*).

Figure 4:
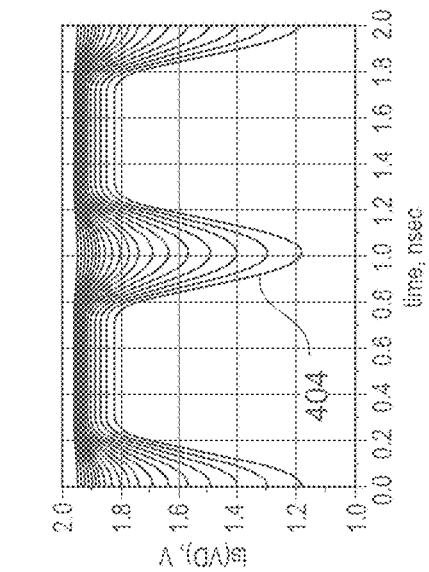
FIG. 4(a) is a plot of a drain current of a transistor in the voltage sensor circuit of FIG. 2.
FIG. 4(b) is a plot of a drain voltage of the transistor in the voltage sensor circuit of FIG. 2.
Figure 4:
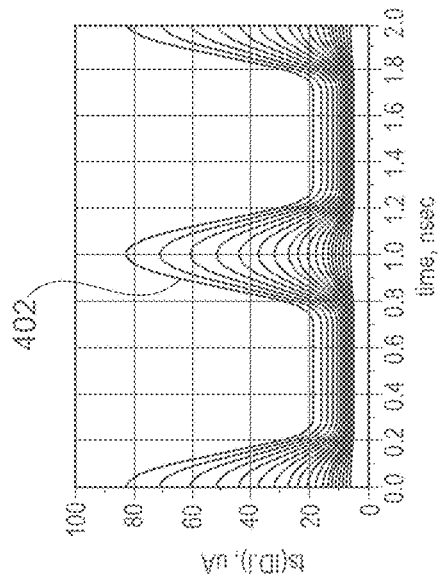

FIG. 4 (*a*) thus shows the drain current 402 and FIG. 4 (*b*) shows the drain voltage 404 transients, occurring at the sensing NMOS transistor drain. The different traces of drain current 402 and drain voltage 404 represent different power levels of the 1 GHz input signal.

Figure 5:
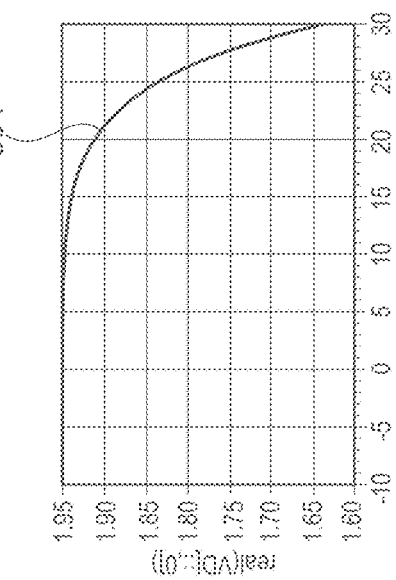
FIG. 5(a) is a plot of the output voltage of the filter in the voltage sensor circuit of FIG. 2.
FIG. 5(b) is a plot of the DC output voltage of the voltage sensor circuit of FIG. 2 versus the input power into the RF antenna aperture switch.
Figure 5:
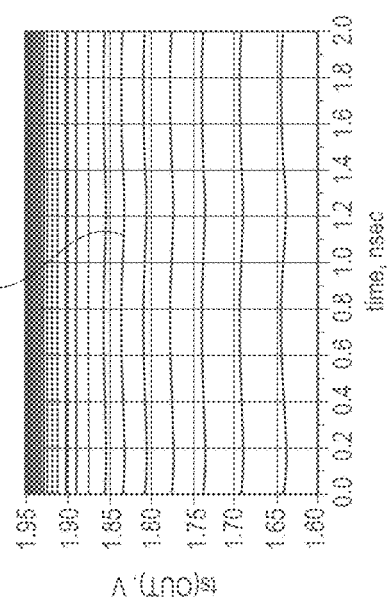

The rectified voltage $V_D$ shown in FIG. 4 (*b*) contains a DC voltage component, which is filtered by a subsequent low-pass filter, e.g. formed by $R_{Filt}$ and $C_{Filt}$ in an embodiment. In FIG. 5 (*a*) this filtered transient output signal $V_{out}$ labeled 502 can be seen, which has a clearly visible DC component and only a small RF ripple. Stronger filtering can even further decrease the ripple, if desired for a specific application. In FIG. 5 (*b*), the DC voltage labeled 504 of $V_D$ or $V_{out}$ is plotted versus the input power being present at $V_{in}$. It can be seen, that the output voltage can be attributed to an input power in a certain power sensing range.

FIG. 5 (*a*) thus shows a transient voltage 502 at the output of the RC-filter for different power levels, and FIG. 5 (*b*) shows the DC voltage 504 of the voltage sensor plotted versus input power into the RF stack.

The sensing range can be varied as desired by the use of different circuit elements. For example, increasing the lowest drain-source resistance $R_{DS1.1}$ and decreasing the corresponding resistance $R_{DS1.2}$ increases the amount of voltage swing $V_P$ entering transistor $T_{sens}$ and therefore increases the amount of drain current $I_D$ being rectified in the sensing transistor. Increasing the resistor might have a drawback of detuning the voltage stack, because the parasitic elements of transistor $T_{sens}$ can have a stronger influence. Changing circuit element values to provide different sensing ranges that have to be monitored carefully to preserve switch performance. Another possibility to vary the sensing range could be to increase the resistance $R_{sens}$. Increasing the resistance causes the voltage drop due to the drain current $I_D$ to increase and a smaller portion of the probe voltage $V_p$ is needed to build up a DC potential. But increasing the sense resistance has to be traded-off with the quiescent current $I_D$, which occurs in $T_{sens}$ for a DC gate biasing of zero volts, as well as with the maximal voltage swing occurring at the transistor $T_{sens}$ before cutting of the transistors VDS operation. A further influence on the obtainable output voltage is influenced by the transistor geometry, which changes the detuning to the RF stack by its parasitic capacitances and the current increase by inherent influence of the transconductance. Relatively small sizes for transistor $T_{sens}$ are ideally used.

Figure 6:
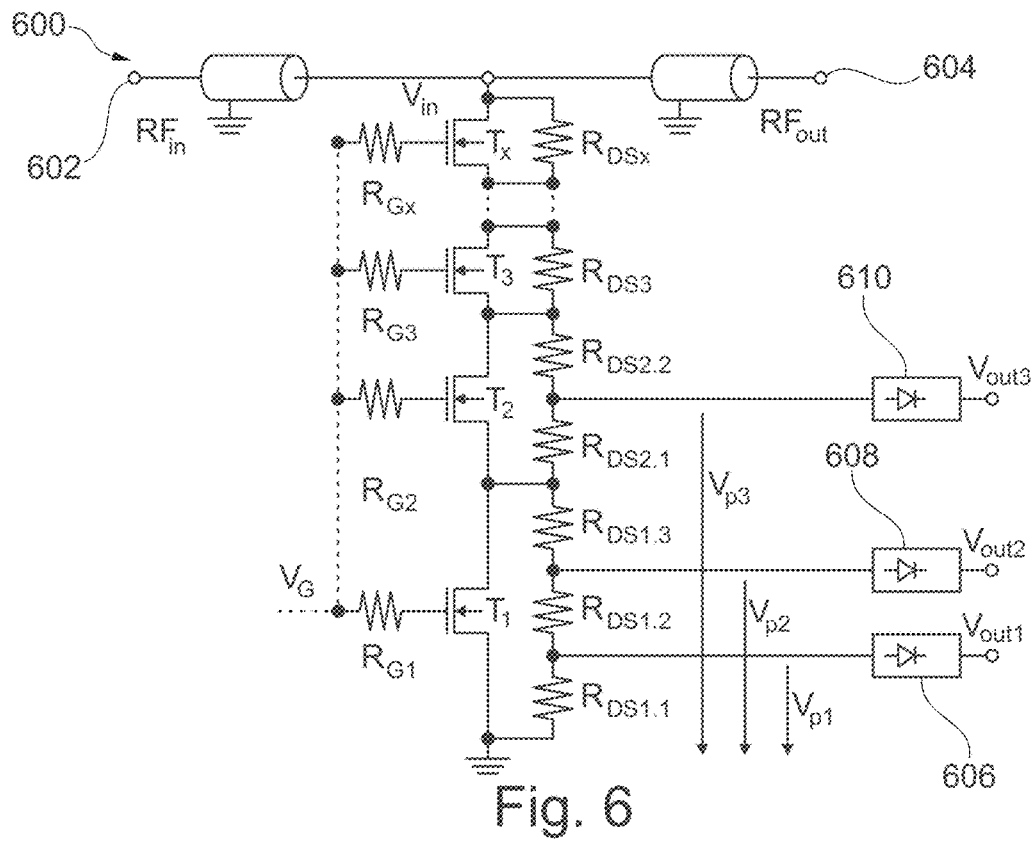
FIG. 6 is circuit diagram of an embodiment having a plurality of voltage sensor circuits at different internal switch nodes to measure different input power ranges of the RF antenna aperture switch.

An increased sensing range could be achieved for example by placing different sensing transistors $T_{sens}$ between different sensing nodes in the $R_D S$ stack and ground potential, as can be seen in FIG. 6. The circuit 600 of FIG. 6 is similar to the circuit 200 of FIG. 2, previously described, but with different sensors at different nodes of the RF stack to measure an increased input range. Circuit 600 includes an RF input 602, $RF_{in}$ and an RF output 604, $RF_{out}$. In the example of FIG. 6, a first voltage divider includes resistors $R_{DS1.1}$, $R_{DS1.2}$, and $R_{DS1.3}$, and includes two taps for providing voltages $V_{p1}$ and $V_{p2}$. A second voltage divider includes resistors $R_{DS2.1}$ and $R_{DS2.2}$, and a tap for providing voltage $V_{p3}$. A first sensing circuit 606 is coupled to the $V_{p1}$ tap, a second sensing circuit is coupled to the $V_{p2}$ tap, and a third sensing circuit 610 is coupled to the $V_{p3}$ tap. Any number of voltage dividers, taps, and voltage sensing circuits may be used. The exact configuration shown in FIG. 6 is therefore only one example for providing additional sensing ranges. In FIG. 6, sensing circuits 606, 608, and 610 are substantially the same as those previously described in circuit 200 of FIG. 2.

Circuit 600 allows several output voltages $V_{out1}$, $V_{out2}$, and $V_{out3}$ to be read out, which represent different input voltage ranges $V_{in}$ and can be combined to increase the overall range. The output voltage of different voltage sensors can be seen in FIG. 7 for three sensors similar to those shown in FIG. 6. However, as previously described care has to be taken on the influence to the RF stack, and not to disturb proper wanted operation.

Figure 7:
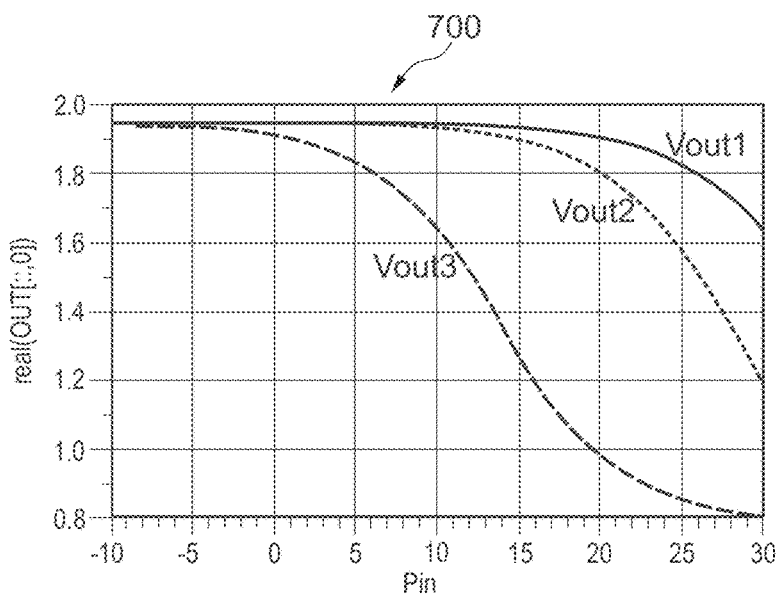
FIG. 7 is a plot of different voltage sensor output voltages of the circuit of FIG. 6 versus input power into the RF antenna aperture switch.

FIG. 7 thus shows a plot 700 of voltage versus input power of three output voltages corresponding to output voltages $V_{out1}$, $V_{out2}$, and $V_{out3}$. The three different sensors 606, 608, and 610 at the different nodes related to the $V_{p1}$, $V_{p2}$, and $V_{p3}$ voltages of the RF stack are used to measure an increased input range as was shown in FIG. 6 and described above.

The output voltages $V_{out}$ from the single voltage sensor or the multiple voltage sensors could be provided to an analog-to-digital converter (not shown), which samples the DC voltage values and passes it to a subsequent control-unit for further processing. This processing could include an over-voltage warning, which allows performing actions to protect the antenna switch or other components in its vicinity, or to report the amount of voltage swing present, allowing knowledge about the antenna radiation performance. In the second case, the occurring RF voltage swing can be a measure for the voltage distribution across the antennas dimension and can give information about the antenna's radiation behavior, such as linearity. As well as in the second instance, countermeasures to improve voltage distribution such as altering the radiation impressed on the RF switch could be performed.

Figure 8:
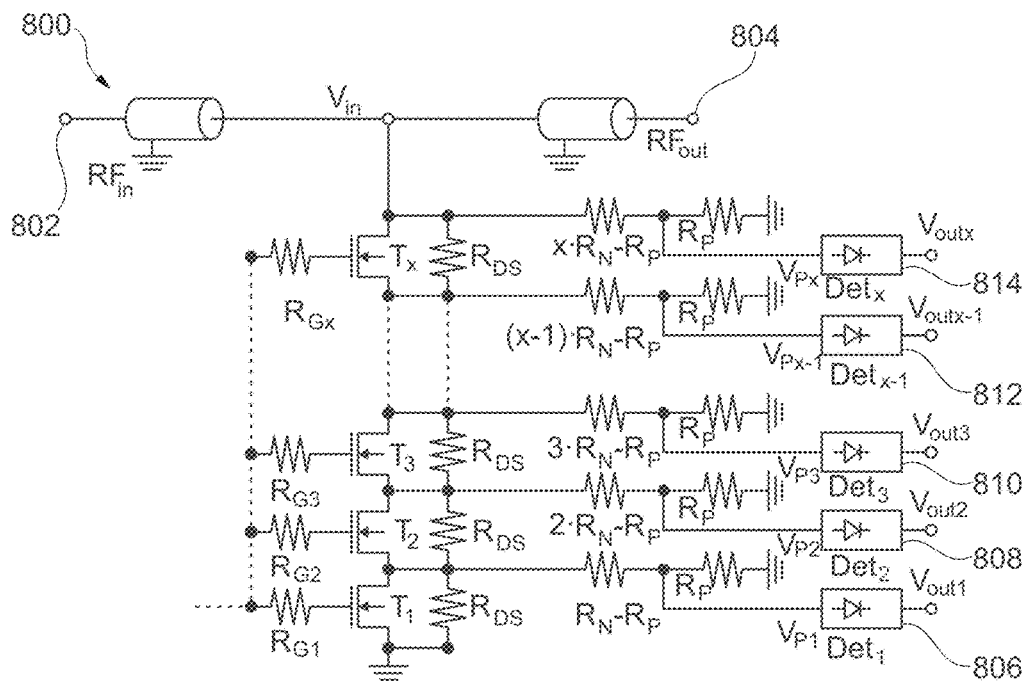
FIG. 8 is a schematic diagram of an embodiment circuit including a plurality of voltage dividers and voltage sensors circuits coupled to an RF antenna aperture switch configured to provide a linearity indication.

In the above described circuit embodiments, at least one RF voltage to ground is determined and monitored. Next, embodiment circuits to measure the differences between the drain-source nodes of the transistors in the RF stack are discussed. In the subsequently described circuit embodiments, the voltage distribution across the transistors in the stack can be quantified. As can be seen in FIG. 8, at every drain node of the stacked RF transistors $T_1$ to $T_X$, a voltage divider to ground is placed. The voltage divider connected to the drain of the lowest transistor $T_1$ has an overall value of $R_N$, which is made large enough not to distort the performance of the RF stack. Typical values of $R_N$ could be in the range of 50 to 120 times $R_D S$. The resistor at the drain of the next transistor $T_2$ has twice the value of $R_N$ and so on, until the resistance at the highest drain node of transistor $T_x$ has a value of $x \cdot R_N$. The probe resistor $R_P$ is subtracted from the resistors $n \cdot R_N$ and are all equal in value and in the range of the value of $R_{DS}$. By this arrangement, the circuit swing across each stack resistance is scaled to a small reference voltage swing.

In FIG. 8, an embodiment switch arrangement 800 is shown including the RF source, the RF switch stack, a plurality of voltage dividers, and a plurality of sense circuits. The RF input 802 and RF output 804, and the RF stack are as previously described. The plurality of voltage dividers are coupled to the drains of the corresponding stack transistor and one of the resistors in the divider is scaled with switch position as previously discussed. Sense circuits 806, 808, 810, 812, and 814 are coupled to the taps $V_{P1}$, $V_{P2}$, $V_{P3}$, $V_{Px-1}$ of a corresponding voltage divider, $V_{PX}$, and have corresponding output voltages $V_{out1}$, $V_{out2}$, $V_{out3}$, $V_{outx-1}$, and $V_{outx}$.

FIG. 8 thus shows a circuit embodiment 800 to determine the RF voltage swing across the drain-source nodes of each transistor in the RF switch stack. As will be explained in further detail below, a perfectly linear switch will provide a plurality of output voltages that are all equal. A non-linear switch will provide a plurality of output voltages that are unequal and typically show a curve indicating that larger drain-source voltages are associated with transistors closer to the RF source and that relatively smaller drain-source voltages are associated with transistors closer to ground. Of course, other anomalous non-linear patterns can also be detected with circuit 800 of FIG. 8.

Figure 9:
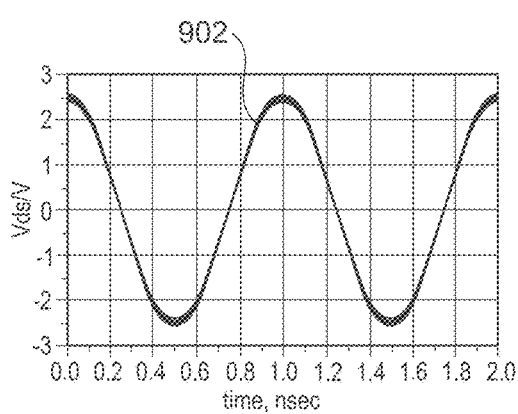
FIG. 9(a) is a plot of the voltages across the RF switch cells of the circuit of FIG. 8 without the voltage dividers being connected.
FIG. 9(b) is a plot of the voltages across the RF switch cells of the circuit of FIG. 8 with the voltage dividers being connected.
Figure 9:
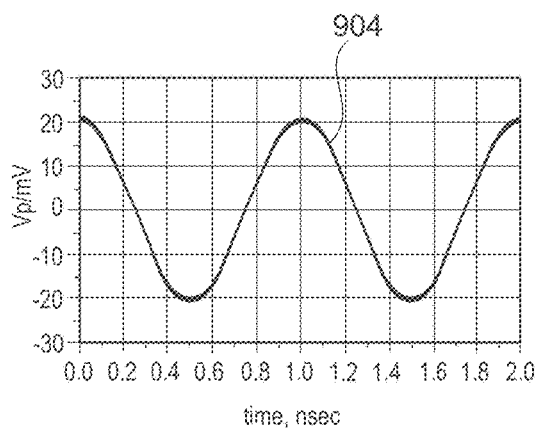

Referring now to FIG. 9 (a), the voltage distribution is shown on a stack of 18 $R_{DS}$ resistances only. In this instance, the unbalancing effect of the sensing transistors is not present and the influence of the resistances $R_N$ can be checked. The distribution of the voltages 902 can be seen in FIG. 9 (a), where the voltage across the $R_{DS}$ resistances is plotted. Later, once the transistors are added back in, this will be the voltage difference between the drain voltages of the transistors subtracted by the source voltage of the transistors. The broadness of curve 902 indicates that a small influence of the probing arrangement previously discussed is still present within the RF stack, but this is negligibly small and can further be decreased by adjusting the resistor $R_N$ resistor component in the voltage divider to address this error. In FIG. 9 (b), the output voltage swing $V_P$ at the resistances $R_p$ of the different nodes can be seen. Due to the resistive divider, it is much smaller, but still a significant voltage swing is measured. As well as shown in FIG. 9 (a), here the minor broadening of the curve 904 indicates a small influence of the probing arrangement. The probe amplitudes can be seen in FIG. 9 (b). Because they are more than a factor of ten smaller than the probe voltages in FIG. 3 (b) of the previously described circuit 200, a more refined voltage sensor is ideally used and will be described in further detail below.

FIG. 9 (a) thus shows the drain-source voltage across the RF stack of 18 $R_{DS}$ resistors at an input voltage of 45 V. FIG. 9 (b) shows the probe voltages $V_p$ at resistances $R_p$ to ground.

The voltage sensors for circuit 800 are similar to the voltage sensor circuits as previously described, but having additional gain to compensate for the lower value of the sensed voltages. The simplified schematic of an embodiment voltage sensor 1000 can be seen in FIG. 10. Circuit 1000 includes the sensing transistor $T_{sens}$ with drain side connected resistor $R_{sens}$ and the subsequently connected low-pass filter, here for example using $R_{Filt}$ and $C_{Filt}$. Additionally, to increase the sensitivity of the readout, a reference branch is connected in a similar arrangement to the sensing branch using reference transistor $T_{ref}$, reference resistor $R_{ref}$ and the low-pass filter having the same $R_{Filt}$ and $C_{Filt}$ components. The input (gate) of the $T_{ref}$ transistor is terminated with a resistance $R_p$, but no connection to the voltage divider of the RF stack is used. The reference branch provides the same quiescent current through the reference transistor and builds up a reference voltage $V_{ref}$ through the resistance $R_{ref}$, especially, when the values of the elements are the same as in the sensing branch. When an RF voltage swing is present in the RF stack, a difference between $V_{sens}$ and $V_{ref}$ is amplified by the operational amplifier OPA designated 1002 and increases the operational range of the voltage sensor. The benefit of using an amplifier at this side of the chain, is that only DC signals must be amplified, which is much easier than amplifying RF signals and that a voltage amplification with high-ohmic circuits can be done, which reduces the detuning of the RF stack.

Figure 10:
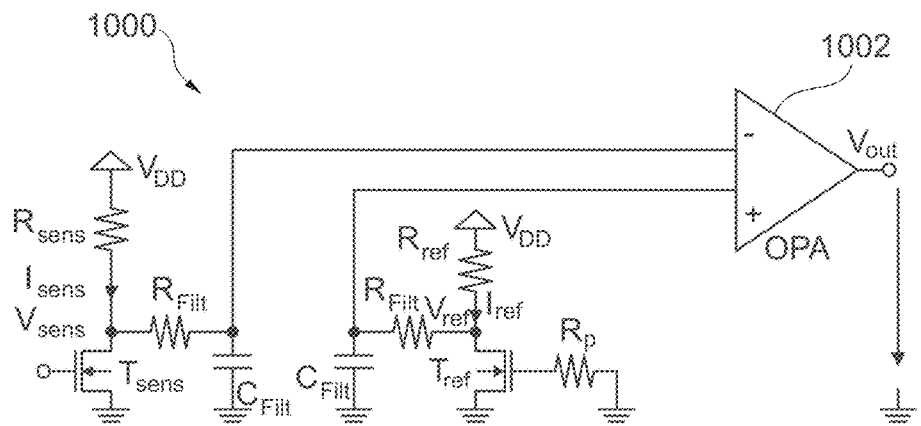
FIG. 10 is a schematic diagram of an embodiment RF voltage sensor circuit, including a reference branch and an operational amplifier.

FIG. 10 thus shows an RF voltage sensor circuit, including a voltage sensor portion, a reference branch, and an operational amplifier for amplifying a voltage difference between the voltage sensor portion and the reference branch.

Figure 11:
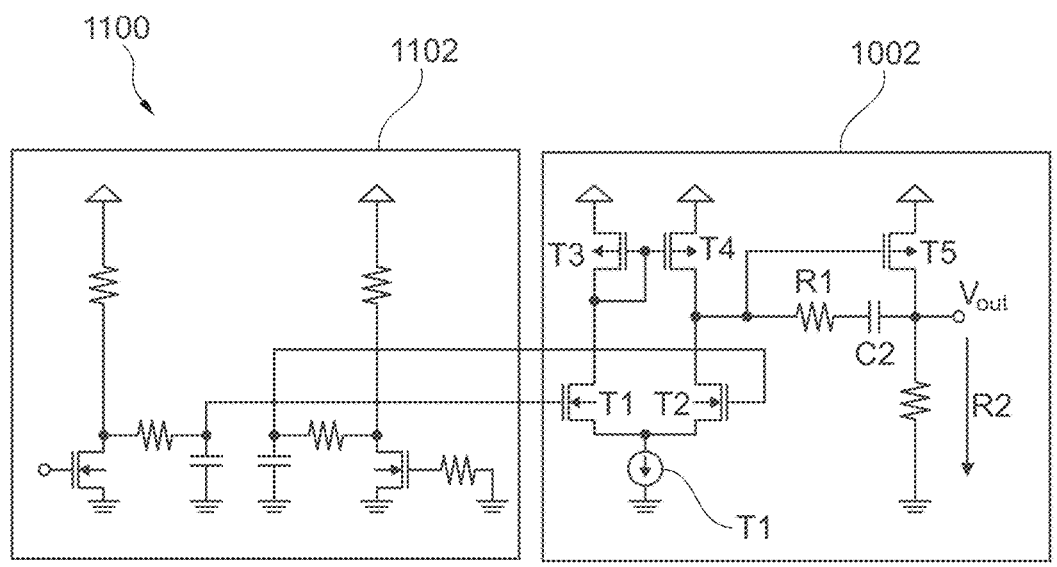
FIG. 11 is a schematic diagram of the circuit of FIG. 10 including an example circuit implementation of the operational amplifier.

In FIG. 11, the RF sensing circuit 1100 with the reference branch can be seen together with an example implementation of the operational amplifier. The sensing circuit and reference branch in block 1102 are as previously described. In a circuit embodiment, operational amplifier 1002 includes a differential amplifier comprising current source I1, differential pair of transistors $T_1$ and $T_2$, and simple current mirror load $T_3$ and $T_4$. Operational amplifier 1002 also includes an output stage including transistor $T_5$, and associated biasing and compensation components $R_1$, $R_2$, and $C_2$.

FIG. 11 thus shows an RF voltage sensor circuit 1100, including a reference branch and an example implementation of the operational amplifier 1002.

In FIGS. 12 (a) and (b) a sweep of the RF input power into the stack at one voltage sensor can be seen. In FIG. 12 (a) the internal voltages $V_{sens}$ 1204 and $V_{ref}$ 1202 can be compared to each other. In FIG. 12 (b), the output voltage 1208 at one operational amplifier can be seen. For reference, the voltages of $V_{sens}$ and $V_{ref}$ (seen as a composite trace 1206 due to the different voltage scale in FIG. 12 (b)). It can be seen that the output voltage $V_{out}$ 1208 is dependent on the input power into the RF stack.

FIG. 12 (a) thus shows the DC voltage $V_{sens}$ and $V_{ref}$ occurring in one voltage sensor, swept across stack input power levels and FIG. 12 (b) shows the output amplitude $V_{out}$ of one operational amplifier output swept versus stack input power.

The RF stack of FIG. 8 is built using the 18 resistances $R_{DS}$, including the RF transistors, connecting the $R_N$ resistance network and the voltage sensors at each node $V_P$ in an embodiment. In FIG. 13, a comparison of the RF voltage distribution at a low RF input voltage of 30 dBm (=10 V) into the RF port can be seen in trace 1302. The plot of FIG. 13 shows the magnitudes of the drain-source voltage difference versus transistor number T1 to T18. Due to convergence issues, the simulated power could not be increased above this value, but the voltages scale in the same way at higher input power levels. An ideal equal distribution is calculated by 10 V/18=0.55 V across the drain-source voltage. The hanging voltage distribution 1302 seen in FIG. 13 is a result of parasitic substrate capacitances and is well explained in the literature and referenced above. As can be seen here, the curves are substantially identical when comparing the curves with and without resistive probing network, and so are referred to with a single identifying numeral 1302. This indicates that the probing network does not detune the proper circuit operation.

FIG. 13 thus shows the RF voltage distribution across the drain-source terminals of the 18 RF transistors in the switch stack. The comparison shows a negligible influence for the resistive probing network being connected or not.

Figure 14:
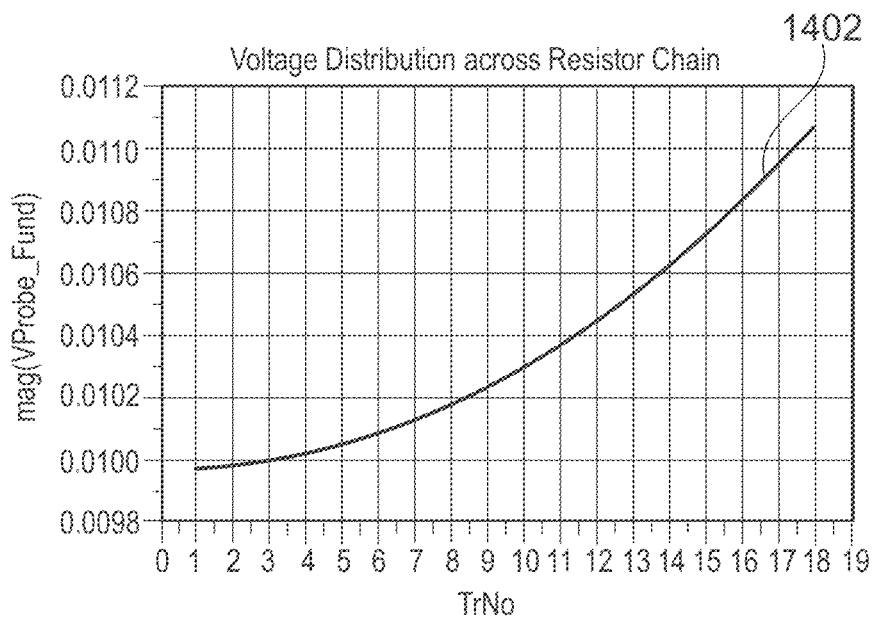
FIG. 14(a) is a plot of the voltage distribution across the probing resistors of the circuit of FIG. 8.
FIG. 14(b) is a plot of a similar voltage distribution across the operational amplifier voltage outputs of the circuit of FIG. 8.
Figure 14:
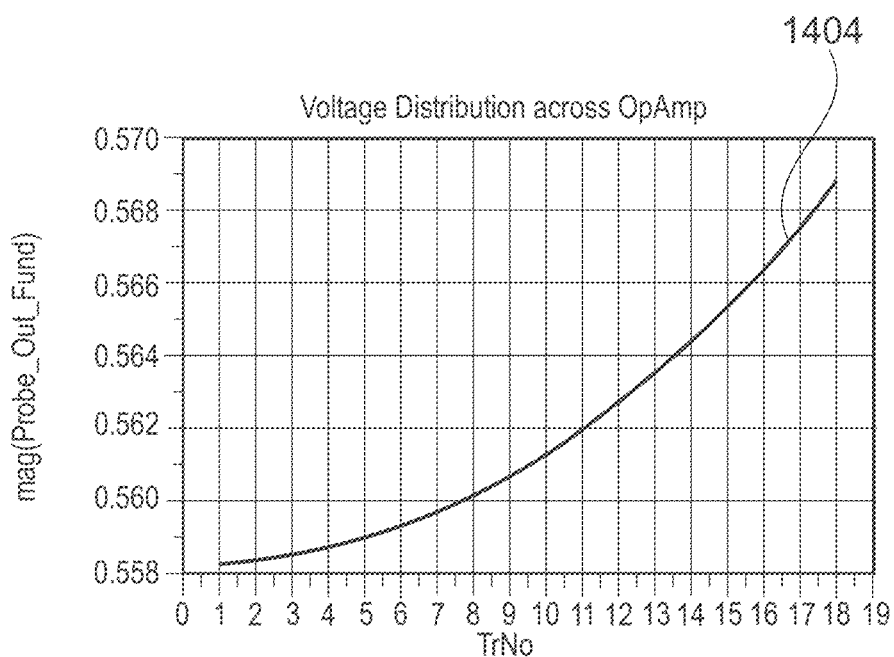

In FIG. 14 (a), the voltage distribution $V_{px}$ 1402 of the 18 nodes at the probe resistances $R_p$ can be seen. The same hanging curve was shown appearing across the drain-source nodes at the transistors directly. The similarity of the curves demonstrates that the distribution of voltages can be probed by the arrangement of FIG. 8. In FIG. 14 (b) the voltage distribution 1404 at the output of the 18 operational amplifiers is shown. The shape of the distribution 1404 is the same as was shown in FIG. 13 and is equivalent to the drain-source voltage distribution of the RF transistor stack.

FIGS. 14 (a) and (b) thus shows the voltage distribution at the probing resistors Rp (FIG. 14(a)) and the output of the operational amplifiers Vout (FIG. 14(b)), showing an equivalent shape compared to the drain-source voltage swing of the RF transistors.

By reading the output voltages of the voltage sensors, the voltage distribution at each drain node of the transistor stack can be visualized. Similar to the sensor circuit embodiments in the first part of the description, the readout of the output voltages can be done using an analog to digital converter. The information about the voltage distribution can be used in a subsequent control unit for further processing and measures such as adjusting the RF input power or in making other adjustments in the operating condition of the RF switch.

Circuit embodiments could be used to influence both internal systems and customer systems. In internal systems they could be used for a deeper circuit analysis in the design phase or during product testing. The customer system could benefit from sensed internal node voltages by being able to monitor these during the customer design phase, for design-in at the customer, for debugging or for use during normal operation.

Sensing circuits have been described in various embodiments, which make internal circuit nodes of an RF switch available to the outside world but not disturbing the desired operation of the RF switch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF switch comprising:
   a plurality of series-coupled RF switch cells coupled between an RF input and ground;
   a plurality of voltage dividers, each of the voltage dividers being coupled to a corresponding one of the RF switch cells; and
   a plurality of voltage detectors, each voltage detector having an input coupled to a tap of a corresponding one of the voltage dividers, and an output for providing a DC voltage, a plurality of the DC voltages configured to provide a linearity indication of the RF switch.

2. The RF switch of claim 1, wherein each of the RF switch cells comprises a transistor.

3. The RF switch of claim 2, wherein each of the RF switch cells further comprises a first resistor across the transistor.

4. The RF switch of claim 3, wherein each of the RF switch cells further comprises a second resistor coupled between an input signal source and a control node of the transistor.

5. The RF switch of claim 1, wherein each of the plurality of voltage dividers comprises:
   a first resistor coupled between the tap and ground; and
   a second resistor coupled between the tap and a corresponding RF switch cell,
   wherein each of the first resistors are equal in value, and wherein each of the second resistors are unequal in value.

6. The RF switch of claim 5, wherein the value of the second resistor in the plurality of voltage dividers is scaled according to a switch position of the corresponding RF switch cell associated with the second resistor.

7. The RF switch of claim 6, wherein the value of the second resistor comprises a linearly scaled value component that scales with RF switch position and a constant value component that does not scale with RF switch position.

8. The RF switch of claim 6, wherein the value of the second resistor in a first RF switch position closest to ground comprises a minimum value, and the value of the second resistor in a last RF switch position closest to the RF input comprises a maximum value.

9. The RF switch of claim 1, wherein each voltage detector of the plurality of voltage detectors comprises a filter.

10. The RF switch of claim 1, wherein each voltage detector of the plurality of voltage detectors comprises a rectifier circuit.

11. An RF switch comprising:
    a plurality of series-coupled RF switch cells coupled between an RF input and ground;
    a plurality of voltage dividers, each of the voltage dividers being coupled across a corresponding one of the RF switch cells; and
    a plurality of voltage detectors, each voltage detector having an input coupled to a tap of a corresponding one of the voltage dividers, and an output for providing a DC voltage, a plurality of the DC voltages configured to monitor a plurality of internal voltage conditions of the RF switch.

12. The RF switch of claim 11, wherein at least one of the plurality of voltage dividers comprises a single tap voltage divider.

13. The RF switch of claim 11, wherein at least one of the plurality of voltage dividers comprises a dual tap voltage divider.

14. The RF switch of claim 11, wherein at least one of the plurality of voltage dividers is associated with an RF switch cell having an intermediate RF switch position between a first RF switch position and a last RF switch position.

15. The RF switch of claim 11, further comprising a single resistor coupled across a plurality of the RF switch cells not coupled to a corresponding one of the plurality of voltage dividers.

16. The RF switch of claim 11, wherein each voltage detector of the plurality of voltage detectors comprises a filter.

17. The RF switch of claim 11, wherein each voltage detector of the plurality of voltage detectors comprises a rectifier circuit.

18. An RF switch comprising:
    a plurality of series-coupled RF switch cells coupled between an RF input and ground;
    a plurality of voltage dividers, each of the voltage dividers being coupled to a corresponding one of the RF switch cells; and
    a plurality of voltage detectors, each voltage detector having an input coupled to a tap of a corresponding one of the voltage dividers, and an output for providing a DC voltage.

19. The RF switch of claim 18, wherein each of the plurality of voltage dividers is coupled across the corresponding one of the RF switch cells.

20. The RF switch of claim 18, wherein each of the plurality of voltage dividers is coupled between a drain node of the corresponding one of the RF switch cells and ground.

* * * * *